United States Patent
Miwa (10) Patent No.: US 7,800,518 B2
(45) Date of Patent: Sep. 21, 2010

(54) PULSE MODULATION METHOD

(75) Inventor: Kenichi Miwa, Tokyo (JP)

(73) Assignee: SMK Corporation, Tokyo (JP)

( * ) Notice: Subject to any disclaimer, the term of this patent is extended or adjusted under 35 U.S.C. 154(b) by 260 days.

(21) Appl. No.: 12/159,896

(22) PCT Filed: Oct. 11, 2006

(86) PCT No.: PCT/JP2006/320262

§ 371 (c)(1),
(2), (4) Date: Jul. 2, 2008

(87) PCT Pub. No.: WO2007/080679

PCT Pub. Date: Jul. 19, 2007

(65) Prior Publication Data

US 2009/0134948 A1    May 28, 2009

(30) Foreign Application Priority Data

Jan. 13, 2006   (JP)   ............................. 2006-006140

(51) Int. Cl.
*H03K 7/04* (2006.01)
*H04Q 1/39* (2006.01)
(52) U.S. Cl. ........................ 341/53; 341/50; 375/237; 375/253; 332/112
(58) Field of Classification Search .................. 341/50, 341/53, 72, 74; 332/106, 112; 375/237, 375/253
See application file for complete search history.

(56) References Cited

U.S. PATENT DOCUMENTS 5,031,196 A * 7/1991 Bahlmann et al. ........... 375/340
5,640,160 A   6/1997 Miwa et al.

FOREIGN PATENT DOCUMENTS

| JP | 55-16575 | 2/1980 |
| JP | 55-30213 | 3/1980 |
| JP | 60-55794 | 4/1985 |
| JP | 60-127852 | 7/1985 |
| JP | 62-100051 | 5/1987 |
| JP | 62-200847 | 9/1987 |
| JP | 10-13237 | 1/1998 |
| JP | 3153084 | 1/2001 |

* cited by examiner

*Primary Examiner*—David Mis
(74) *Attorney, Agent, or Firm*—Edwards Angell Palmer & Dodge LLP (57) ABSTRACT

A pulse modulation method divides code comprising 4N-bit data into 2-bit units of data. For each pulse signal having a fixed pulse width tw, a code modulated signal is generated by pausing between pulse pause intervals Tr. An adjusted time width of between ½ and 1 times the fixed pulse width tw is taken to be Δt. One of time widths 0, Δt, 2Δt, and 3Δt is added to a fixed pause period tm of time intervals according to a corresponding value of the 2-bit data. If the sum total time TD of the code modulated signal is an interval of at least [(2tw+2tm+3Δt)N+Δt], each pulse pause interval Tr is substituted by a pulse pause interval Tr corresponding to the inverted 2-bit data. An inversion flag signal expresses that inversion information is added to the code modulated signal.

2 Claims, 5 Drawing Sheets

FIG. 1A Bit Configuration (Bit Data)

FIG. 1B 2-Bit PPM Modulation Signal

FIG. 1C Secondary Modulation Signal

FIG. 1D Inversion Mode (Inverted Bit Data)

FIG. 1E Inverted 2-Bit PPM Modulation Signal

FIG. 2

| | Flag | 2-Bit Data | Pulse Width | Pulse Pause Interval (Tr) | Pulse Interval (Tu) | Waveform |
|---|---|---|---|---|---|---|
| Normal Mode | 0 0 | 0 0 | tw (12tc) | tm (15tc) | ta (27tc) | |
| | | 0 1 | tw (12tc) | tm+△t (21tc) | ta+△t (33tc) | |
| | | 1 0 | tw (12tc) | tm+2△t (27tc) | ta+2△t (39tc) | |
| | | 1 1 | tw (12tc) | tm+3△t (33tc) | ta+3△t (45tc) | |
| Inversion Mode | 0 1 | 0 0 | tw (12tc) | tm+3△t (33tc) | ta+3△t (45tc) | |
| | | 0 1 | tw (12tc) | tm+2△t (27tc) | ta+2△t (39tc) | |
| | | 1 0 | tw (12tc) | tm+△t (21tc) | ta+△t (33tc) | |
| | | 1 1 | tw (12tc) | tm (15tc) | ta (27tc) | |

FIG. 3

| | | Lower Rank 2 Bits | | | |
|---|---|---|---|---|---|
| | | 0 0 | 0 1 | 1 0 | 1 1 |
| | Tu | ta (27tc) | ta+△t (37tc) | ta+2△t (47tc) | ta+3△t (57tc) |
| Upper Rank 2 Bits | 0 0 | ta (27tc) | 2ta (57tc) | 2ta+△t (64tc) | 2ta+2△t (74tc) | 2ta+3△t (84tc) |
| | 0 1 | ta+△t (37tc) | 2ta+△t (64tc) | 2ta+2△t (74tc) | 2ta+3△t (84tc) | 2ta+4△t (94tc) |
| | 1 0 | ta+2△t (47tc) | 2ta+2△t (74tc) | 2ta+3△t (84tc) | 2ta+4△t (94tc) | 2ta+5△t (104tc) |
| | 1 1 | ta+3△t (57tc) | 2ta+3△t (84tc) | 2ta+4△t (94tc) | 2ta+5△t (104tc) | 2ta+6△t (114tc) |

FIG. 4A (Prior Art) Bit Configuration (Bit Data)

FIG. 4B (Prior Art) 2-Bit PPM Modulation Signal

FIG. 4C (Prior Art) Secondary Modulation Signal

FIG. 4D (Prior Art) Inversion Mode (Inverted Bit Data)

FIG. 4E (Prior Art) Inverted 2-Bit PPM Modulation Signal

FIG. 5
(Prior Art)

|  | Flag | 2-Bit Data | Pulse Width | Pulse Pause Interval (Tr) | Pulse Interval (Tu) | Waveform |
|---|---|---|---|---|---|---|
| Normal Mode | 0 0 | 0 0 | t | t | 2 t |  |
|  |  | 0 1 | t | 2 t | 3 t |  |
|  |  | 1 0 | t | 3 t | 4 t |  |
|  |  | 1 1 | t | 4 t | 5 t |  |
| Inversion Mode | 0 1 | 0 0 | t | 4 t | 5 t |  |
|  |  | 0 1 | t | 3 t | 4 t |  |
|  |  | 1 0 | t | 2 t | 3 t |  |
|  |  | 1 1 | t | t | 2 t |  |

FIG. 6A (Prior Art) Code Modulated Signal

FIG. 6B (Prior Art) Amplification Output

FIG. 6C (Prior Art) Comparator Output

FIG. 6C1 (Prior Art) Comparator Output

FIG. 6C2 (Prior Art) Comparator Output

PULSE MODULATION METHOD

CROSS-REFERENCE TO RELATED APPLICATION

This is a U.S. National Phase Application under 35 U.S.C. §371 of International Patent Application No. PCT/JP2006/320262 filed Oct. 11, 2006, which claims the benefit of Japanese Application No. 2006-006140 filed Jan. 13, 2006, both of them are incorporated by reference herein. The International Application was published in Japanese on Jul. 19, 2007 as WO 2007/080679 A1 under PCT Article 21(2).

FIELD OF THE INVENTION

The present invention relates to a pulse modulation method that pulse modulates code comprising a plurality of bit data, and more specifically, relates to a pulse modulation method used in infrared communications devices such as IR modules, remote control transceivers, and the like.

BACKGROUND OF THE INVENTION

In the past, pulse phase modulation (PPM) was the method used in infrared transceivers to control actuation of household electronic devices and the like using infrared rays. In pulse phase modulation, data code, in which control data to control the device to be controlled is coded, undergoes PPM modulation into code modulated signals in which differing pulse pause intervals Tr are set based on the values of that bit data. In order to prevent mixing signals with those from other devices and causing erroneous actuation, the 2-bit PPM modulated signal is transmitted by infrared rays to the device to be controlled using a 38 kHz carrier modulated wave as a secondary modulation signal.

This pulse phase modulation method generally used in the past expressed data with a pulse pause interval Tr for each bit. As a result the transmission period TD for sending all of the code became lengthy, and the transmission speed was slow.

As disclosed by Japanese Patent No. 3153084, Applicants previously invented a pulse modulation method that is set by dividing the code into 2-bit data units, and by correlating a differing pulse pause interval Tr to each 2-bit data unit. The transmission period TD of all the modulated code modulation signals is compared to the period TD when all of the bit data of the code has been inverted, and if the transmission period TD has been shortened by inverting, an inversion flag indicating the signal is inverted is added to the code modulation signal produced from the inverted bit data, and this is transmitted.

This pulse modulation method will be explained below using FIGS. 4 and 5. FIG. 4(*a*) indicates a bit configuration of code to undergo pulse modulation. As indicated in the diagram, 16-bits of ID data and data code are divided into 8 units each comprising 2 bits of consecutive data, and pulse modulation is conducted on each unit. Specifically, a pulse signal with a pulse width t is generated for every unit, which is followed by one of 4 types of pulse pause intervals Tr that are set corresponding to the value of the 2-bit data when each 2-bit data group is taken as a data unit, thereby comprising the 2-bit PPM modulated signal indicated in FIG. 4(*b*). Further, as indicated in FIG. 4(*c*), in order to prevent mixing signals with those from other devices and causing erroneous actuation, the 2-bit PPM modulated signal is transmitted by infrared ray to the device to be controlled using a 38 kHz carrier modulated wave as a secondary modulation signal.

Figure 5:
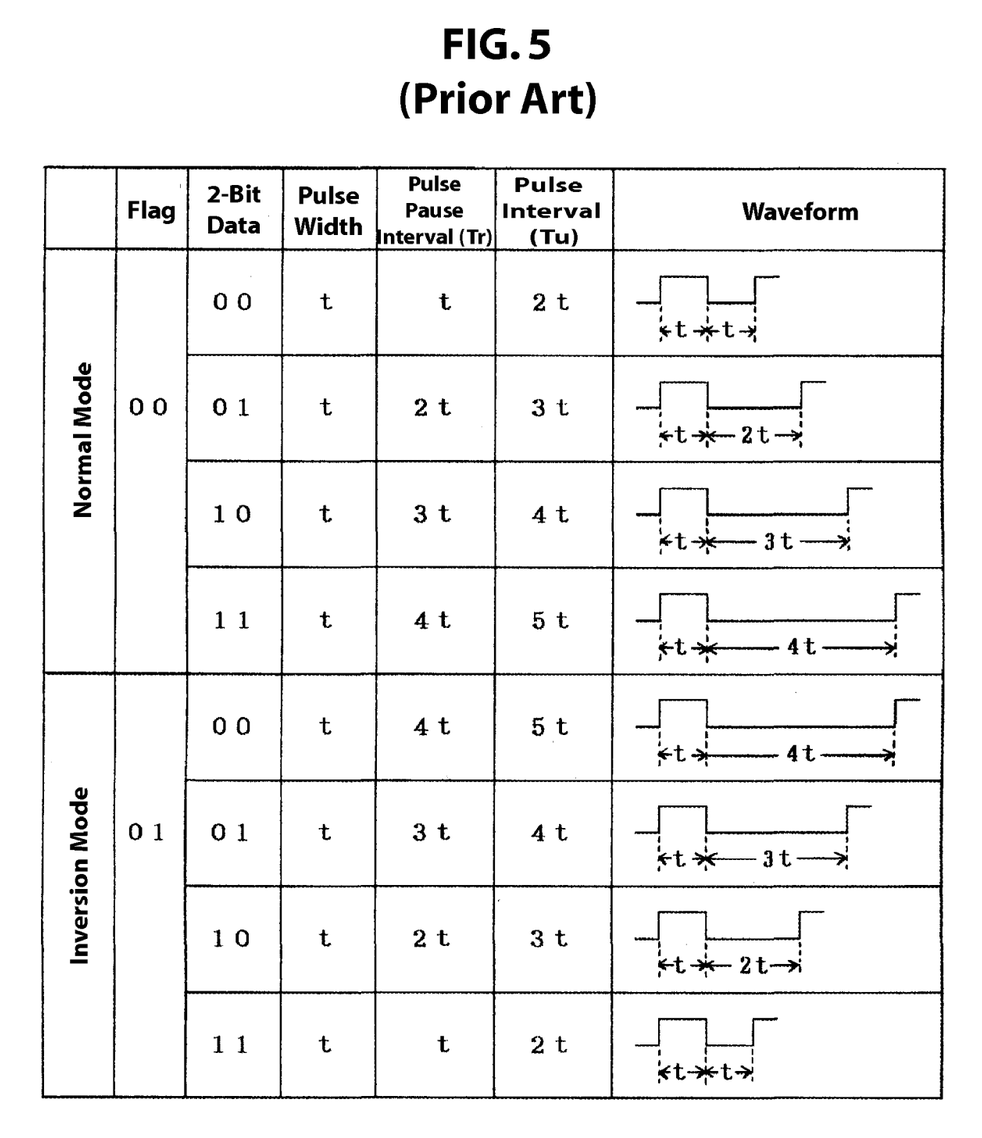
FIG. 5 is a modulation format diagram of the normal mode and inversion mode of a conventional pulse modulation method.

As indicated by the normal mode in FIG. 5, in this conventional example, after the pulse signal of pulse width t has been generated, if the 2-bit data is (0,0), the pulse pause interval Tr is set to the same interval as the pulse width t; if (0,1), the pulse pause interval Tr is set to an interval of 2t; if (1,0), the pulse pause interval Tr is set to an interval of 3t; and if (1,1), the pulse pause interval is set to 4t.

The transmission period TD of the code modulated signal modulated in this way varies between 16 t, if all of the 2-bit data is (0,0), and 40 t, if all of the 2-bit data is (1,1). Specifically, the transmission period TD will vary depending on the value of the 16-bit data of the code, and will be shorter if most of the 2-bit data contained is assigned short pulse pause intervals Tr, and conversely, will be longer if most of the 2-bit data contained is assigned long pulse pause intervals Tr.

Figure 4A:
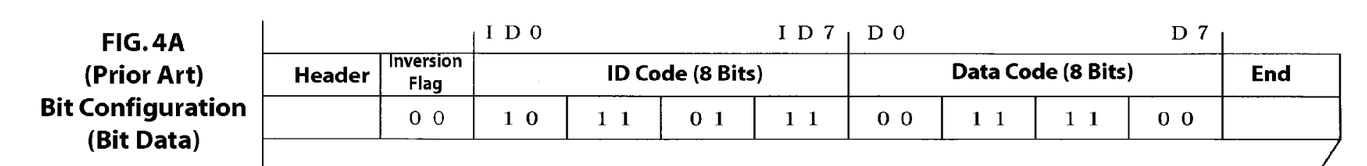
FIGS. 4(a) through 4(e) present bit configurations and waveform diagrams relating to the code modulated signal of code modulated by a conventional pulse modulation method.
Figure 4B:
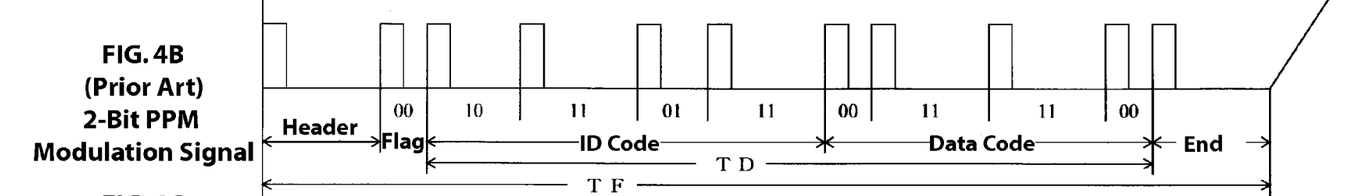
Figure 4C:
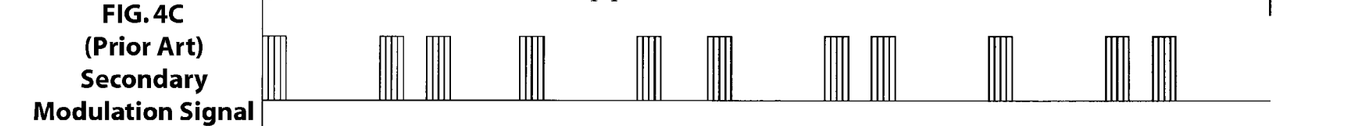
Figures 4D, 4E:
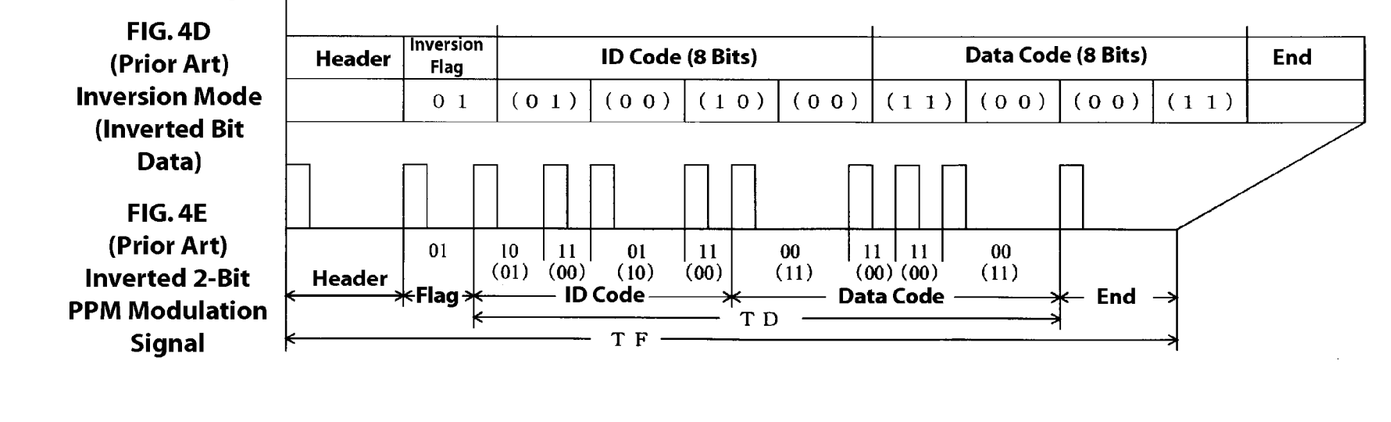

The transmission period TD generated from 4N-bit data (N is a positive integer) has a reverse threshold value X of 7Nt depending on the value of the bit data. The pulse widths t contained in the pulse intervals Tu of the units of the transmission period TD are equal in every unit comprising 2-bit data, and therefore, if the sum total of pulse pause intervals Tr of the code modulated signal is at least [5N+1] t or more, the transmission period TD can be shortened by inverting the 4-bit data. As indicated by the inversion mode in FIG. 4(*d*), the values of all the bit data are inverted, and an inverted 2-bit PPM modulated signal code modulated signal is generated using the pulse pause interval Tr (FIG. 4(*e*).

Next, the fact that the value of the bit data has been inverted and modulated is included in the 2-bit PPM modulated signal as expressed by the flag (0,1), and then transmission becomes possible using a transmission period TD in which the overall code has been shortened.

Figure 6A:
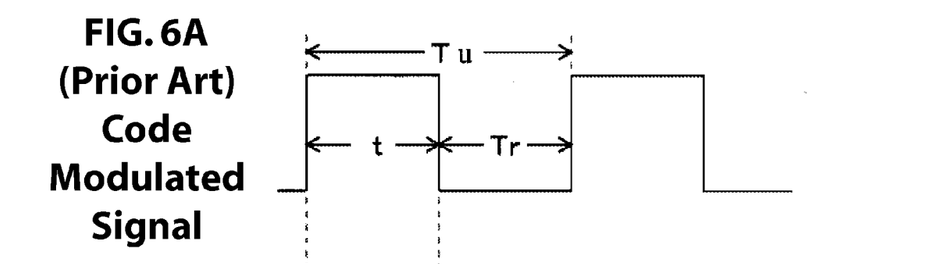
FIG. 6(a) is a waveform diagram of the transmission pulse.
Figure 6B:
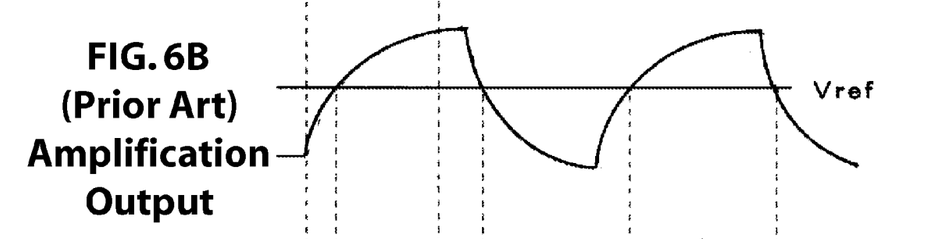
FIG. 6(b) is a waveform diagram indicating the relationship between the threshold value and the amplified signal that is compared by a comparator on the receiving side.
Figure 6C:
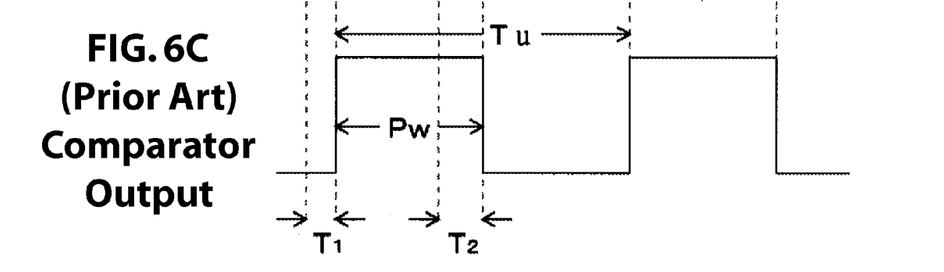
FIG. 6(c) is a waveform diagram indicating the output of the comparator.

The code modulated signal (2-bit PPM modulated signal) used in infrared remote control transmitters such as general household electronic products are transmitted to the devices to be controlled using secondary modulated signals that modulate 38 kHz carrier waves. After the device to be controlled has received and photoelectrically converted the infrared light containing the secondary modulated signals, the signals are amplified by an amplification circuit, and as indicated in FIG. 6(*b*), the amplified output is compared with a specified threshold value Vref, and is demodulated into the code modulated signals indicated in FIG. 6(*c*).

Depending on the characteristics of the amplification circuit, the rising and falling of the pulses of the demodulated code modulated signals will not be constant because the respective T1 and T2 delays as well as the rise and fall will vary depending on the affects of the light emission element, light receiving element, frequency characteristics of the modulation and demodulation circuit, the transmission route, and the like. For that reason, the rise interval between the pulses of the code modulated signal is taken as the pulse interval Tu of the pulse unit comprising 2-bit data, and the 2-bit data of the demodulated code modulated signals are demodulated from the pulse interval Tu.

Figure 6C:
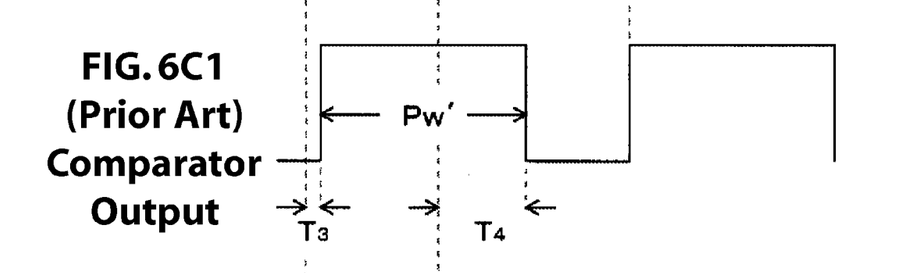

Nonetheless, even with the PPM modulation method that demodulates 2-bit data from the pulse interval Tu of the pulse unit, demodulation errors may occur depending on variations of the rise and fall of the pulses based on the transmission environment. For example, the distance between the infrared remote control transmitter and the device to be controlled is short range, the amount of light received will increase and the amplification output voltage will rise. As indicated in FIG. 6(*c*1), the pulse rise time T3 will be earlier than T1, and conversely, the fall time T4 will be much later than that of T2 because the time of reaching the threshold value Vref or less is delayed.

In this case, the pulse width Pw' (FIG. 6(c1)) is mainly increased by the delay of the fall time T4, and therefore, if that increased portion exceeds the pulse pause period Tr of the code modulated signal prior to modulation, that pulse fall will overlap with the following pulse rise, thereby causing a demodulation error.

The increased portion of the pulse width Pw' generally does not exceed the pulse width t of the code modulated signal, which is set to a length of 12 times the cycle tc of the carrier wave in the infrared modulated signal, and therefore, in the pulse modulation method described above, the shortest pulse pause interval Tr of the code modulated signal is set equivalent to the pulse width t, and demodulation is possible even if the fall time T4 is delayed. However, because 4 types of pulse pause intervals Tr proportional to the pulse width t are set corresponding to the 4 combinations of the 2-bit data, a pulse interval Tu 5 times the maximum pulse width t is assigned to the 2-bit data, and the transmission period TD cannot be fully shortened.

Thus, a method was proposed in Japanese Patent No. 3153084 for shortening the transmission period TD of the overall code modulated signal by multiplying the pulse pause intervals by a compression constant k of 1 or less equivalent respectively to the 4 types of pulse pause intervals Tr that are proportional to the pulse width t. However, because the pulse pause interval Tr in the pulse unit in which the shortest pulse pause interval was set became less than the pulse width t of the original signal, not only was there the risk of generating the demodulation error described above, but also, in an environment where the amount of light of the infrared modulation signal received is reduced, there was the problem of mistakenly demodulating to 2-bit data for which a different pulse pause interval Tr was set.

Figure 6C:
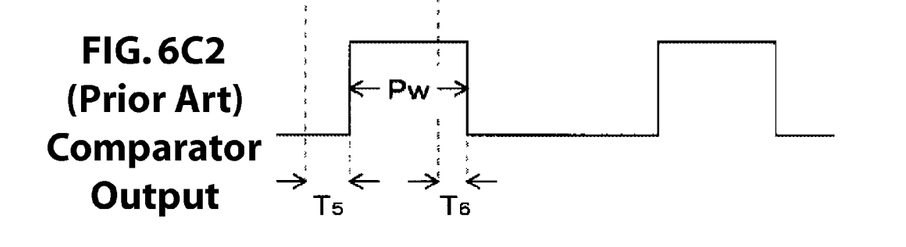

Specifically, if the distance between the infrared remote control transmitter and the device to be controlled is long range, the rise of the amplification output voltage will be delayed because the amount of light received by the device to be controlled has decreased. As indicated in FIG. 6(c2), the pulse rise time T5 will be later than T1, and conversely, after the received light has died off, the fall time T6 will be much earlier than that of T2 because the time of reaching the threshold value Vref or less will come sooner. Under this kind of transmission environment, the pulse rise time T5 is unstable, and a maximum deviation of about ½ of the pulse width t prior to modulation is generated in the pulse interval Tu of the demodulated pulse array. Consequently, if shortening the interval by multiplying the 4 pulse pause intervals Tr, which have been set corresponding to the 2-bit data, by a compression constant k that is 1 or less, there was the risk of producing a demodulation error depending on the transmission environment.

SUMMARY OF THE INVENTION

With a view to these kinds of problem areas in conventional technology, [ ]an object of the present invention is to provide a pulse modulation method that shortens the transmission period TD of the code comprising multiple bit data, and to make possible reliable demodulation even when pulse jitter is produced based on the transmission environment.

In order to achieve the objectives described above, the present invention provides a the pulse modulation method that: divides code comprising 4N-bit data (N is a positive integer) into units configured by every 2 bits of data; after a pulse signal of a fixed pulse width tw has been generated, generates for each unit a code modulated signal by pausing between pulse pause intervals Tr for a pulse signal that has been set corresponding to value of the 2-bit data of that unit; and connects the code modulated signals for all units. An optional adjusted time width of ½ or more and less than 1 of the fixed pulse width tw is taken to be Δt, and 4 types of pulse pause intervals Tr, in which any of the time widths 0, Δt, 2Δt, and 3Δt is added to the fixed pause period tm of time intervals nearly equivalent to the fixed pulse width tw, are set corresponding to the 4 values of the 2-bit data. If the sum total TD of the code modulated signal made from 4N-bit data (N is a positive integer) is an interval of at least [(2tw+2tm+3Δt)N+Δt] or more, the pulse pause interval Tr of every unit is substituted by a pulse pause interval Tr in which the value of the 2-bit data of each unit is set corresponding to the inverted 2-bit data; the substituted pulse pause interval Tr is used to produce a code modulated signal from all of the units; and an inversion flag signal that expresses inversion information is added to the connected code modulated signal.

Code comprising multiple bit data is divided into units configured by every 2 bits of data; pulse phase modulation is conducted taking 2-bit data as the data unit; and demodulation of the code modulated signal is conducted by detecting the pulse intervals Tu of the units from the intervals between rises of the pulse array, and demodulating into 2-bit data. The transmission period TD of the code modulated signal that expresses the code is shortened because pulses are formed for every 2 bits.

Four types of pulse pause interval Tr that are set corresponding to the various values of 2-bit data contain at least a fixed pause period tm of a time interval nearly equivalent to the fixed pulse width tw, and therefore, even if the pulse width increases based on the transmission environment, demodulation errors are not produced. Moreover, the time difference Δt between the 4 types of pulse pause intervals Tr is ½ or more of the fixed pulse width tw, which is the time interval with the maximum delay of pulse rise based on the transmission environment, and therefore, demodulation errors are not produced even if the pulse rise time is unstable. The transmission period TD of the entire code is shortened because the time difference is set to less than the fixed pulse width tw.

If the sum total TD of the code modulated signal generated from the 4N-bit data (N is a positive integer) is an interval of at least [(2tw+2tm+3Δt)N+Δt] or more, the code modulated signal is generated using the pulse pause interval Tr set corresponding to the value of the inverted bit data, and therefore the overall transmission period TD is further shortened. The inverted information can be identified by an inversion flag signal added to the code modulation signal, and if the bit was inverted and modulated, the 4N-bit data can be demodulated having the demodulation circuit invert the demodulated bit data.

Two types of pulse pause intervals Tr, the fixed pause period tm and the time wherein Δt has been added to the fixed pause period tm, may be set corresponding to the inversion information. After a pulse signal of the fixed pulse width tw has been generated, an inversion flag signal is generated by pausing for the pulse signal between pulse pause intervals Tr that have been set corresponding to the inverted information.

The inversion information is transmitted by an inversion flag signal in the same format as that of the code modulated signal, and therefore, the transmission is shortened and no demodulation errors are generated.

According to the present invention, the shortest pulse pause interval Tr comprising the code modulation signal of the units expressing 2-bit data is nearly equal to the fixed pulse width tw, and therefore, even if the rise and fall timing varies and the pulse width increases depending on the transmission environment, it is possible for the code modulated signal to be demodulated, and to have the shortest pulse pause interval.

The four types of code modulated signal of the 2-bit data have a phase difference of $\Delta t$ that at least can be identified even if the pulse rises vary depending on the transmission environment, and therefore, demodulation can be reliably conducted, and the 4 types of pulse pause intervals Tr can be set from combinations of the shortest time intervals. Consequently, the transmission period TD of the overall code can be shortened the most by combining the fixed pulse width tw with the shortest pulse pause intervals Tr that can be demodulated.

The four types of code modulated signals of 2-bit data may be expressed by numeric arrays with equal differences of $\Delta t$, and therefore, the threshold value with the shortest possible transmission period TD can be easily obtained by inverting the bit data based on that mean value.

Modulation of the inversion information may be conducted with the same modulation method as that of the code, and therefore, inversion information is transmitted by the same modulation and demodulation circuit as that of the code. The inversion flag signal may be generated using the shortest 2 of the 4 types of pulse pause intervals Tr corresponding to 2-bit data, and therefore, the overall frame transmission period TF containing the inversion information can be shortened.

BRIEF DESCRIPTION OF THE DRAWINGS

The invention will become more readily apparent from the Detailed Description of the Invention which proceeds with reference to the drawings, in which:

FIGS. 6(a) through 6(c2) provide a comparison of the pulse array on the transmitter side with pulse arrays demodulated by the receiver, wherein: FIG. 6(c1) is a waveform diagram indicating the output of the comparator when the level of the modulated signal received by the receiving side is high; and FIG. 6(c2) is a waveform diagram indicating the output of the comparator when the level of the modulated signal received by the receiving side is low.

DETAILED DESCRIPTION OF THE INVENTION

Figure 1A:
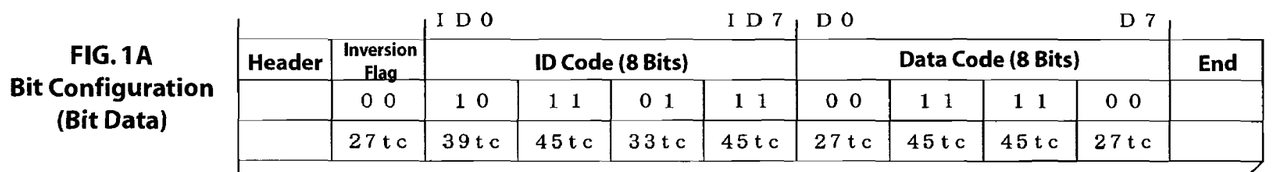
FIGS. 1(a) through 1(e) present bit configurations and waveform diagrams relating to the code modulated signal of code modulated by the pulse modulation method related to one embodiment of the present invention.

The following table provides a key to elements depicted in the drawings and further described herein:
tw Fixed pulse width
tm fixed pause period
$\Delta t$ Adjusted time width
Tr Pulse pause interval Tu Transmission period for each unit
TD Transmission period of code modulated signal The pulse modulation method related to one aspect of carrying out the present invention will be explained below using FIGS. 1 to 3. FIG. 1(a) illustrates a bit configuration of code to undergo pulse modulation according to this aspect. Code comprising ID code and data code, each configured as 8-bit data, is shown in the same bit configuration respective as is indicated in FIG. 4 in order to compare with the conventional PPM modulation method. The ID code stipulates the attributes of the device to be controlled and prevents mixing signals with those from other devices and causing erroneous actuation. The data code codifies the control data to control the device to be controlled.

The 16 bits of ID code and data code data are divided into eight connected units of 2-bit data, and pulse phase modulation is conducted on each unit. Specifically, a pulse signal of fixed pulse width tw is generated for every unit, and subsequently, taking each 2-bit data group as a data unit, one of the 4 kinds of pulse pause intervals Tr indicated in the normal mode of FIG. 2 is added corresponding to the value of the 2-bit data. The modulated signals produced for all of the units are connected to make the code modulated signal shown in FIG. 1(b).

Figure 2:
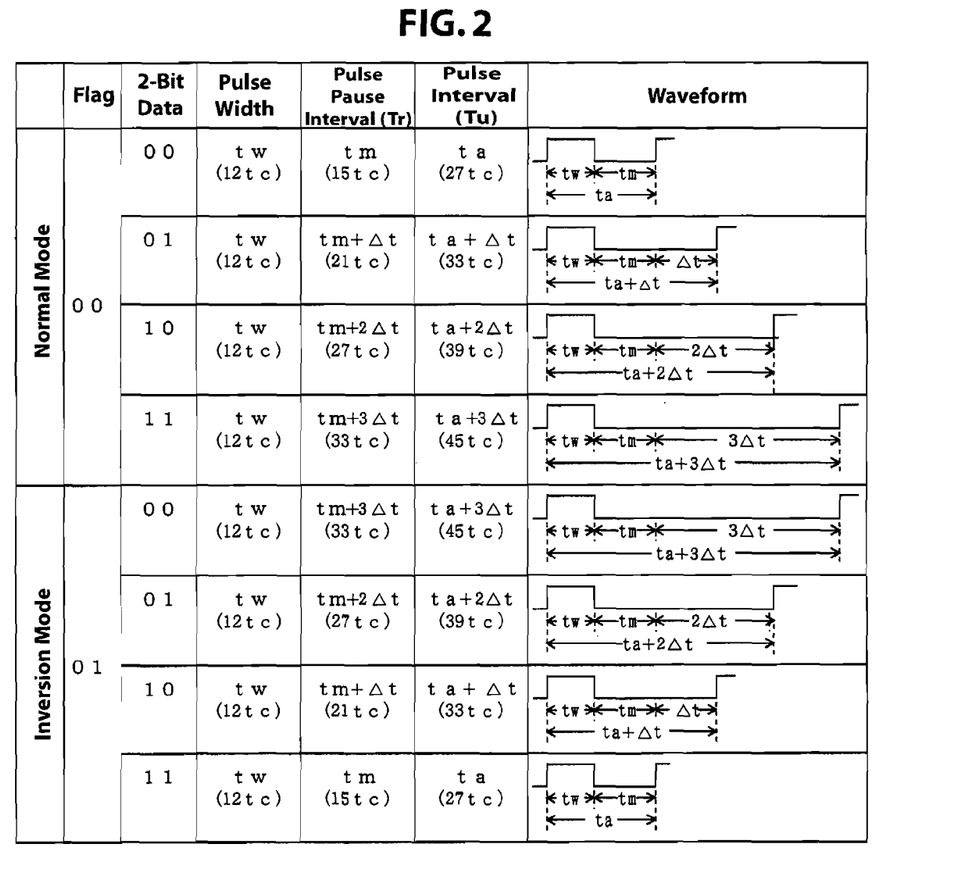
FIG. 2 is a modulation format diagram of the normal mode and inversion mode of the pulse modulation method.

As shown in FIG. 2, a pulse signal of a fixed pulse width tw the same for every unit is generated irrespective of the value of the 2-bit data. The fixed pulse width tw must be set to a length of at least 10 times or more than the cycle tc of the carrier wave so that the envelope line of the carrier wave exceeds the threshold value Vref indicated in FIG. 6(b). Because the frequency of the carrier wave of the a general purpose infrared remote control transmitter is 38 kHz and the cycle tc is approximately 26.3 μsec, the pulse width tw is 316 μsec, which is 12 times the length of the cycle tc of the carrier wave. Where further described below, the time widths of the code modulated signals are expressed in units of the cycle tc of the carrier wave, and the time width of the fixed pulse width tw is expressed by 12 tc.

The four kinds of pulse pause intervals Tr set corresponding to the 4 values of 2-bit data are created by adding any of 0, $\Delta t$, 2$\Delta t$, or 3$\Delta t$ to the fixed pause period tm of the time interval nearly equivalent to the fixed pulse width tw. Consequently, if the transmission environment increases the pulse width, the code modulated signals of each unit will have a pulse pause period longer than the maximum amount of anticipated increase illustrated in FIG. 6(c1), and no demodulation error will be produced based on pulses overlapping forward and backward.

$\Delta t$ is an option adjusted time width more than ½ and less than 1 of the fixed pulse width tw, and here shall considered to be 6 tc (158 μsec), which is ½ of the fixed pulse width. A difference of at least ½ or more of the fixed pulse width tw will thereby be guaranteed between the pulse intervals Tu of the units comprising 2-bits. Even if the amount of light received by the device to be controlled decreases and the rise positions of the pulse vary in the limit of ¼ the fixed pulse width tw, there will be no mistaken demodulation of other bit data when demodulating using the pulse interval Tu.

If not set with the same pulse pause interval, the four kinds of pulse pause intervals Tr corresponding to the 4 values of 2-bit data can be set in optional combinations, but here as indicated in the normal mode of FIG. 2, when the 2-bit data is (0,0), the pulse pause interval is set to the fixed pause period tm; if (0,1), the pulse pause interval is set to the interval of $\Delta t$ added to the fixed pause period; if (1,0), the pulse pause interval is set to the interval of 2$\Delta t$ added to the fixed pause period; and if (1,1), the pulse pause interval is set to the interval of 3Δt added to the fixed pause period. Consequently, the maximum pulse interval Tu of 1 unit is 45 tc, which is 3Δt added to the fixed pulse width tw and the fixed pause period tm, and the transmission time can be greatly shortened compared to 60 tc, which is the maximum pulse interval Tu of the conventional method when the pulse width is the same 12 tc.

As will be described later, if the sum total TD of the code modulated signal made by connecting the modulated signals of all of the units exceeds a specified threshold value X, the pulse pause intervals Tr of the 2-bit data units are set as indicated in the inverse mode of FIG. 2. Specifically, the pulse pause intervals Tr set in the normal mode are set with values corresponding to the inverted values of the 2-bit data of the units, and the code modulated signal is produced from all the units by the same method as that in the normal mode using the pulse pause intervals Tr set in the inversion mode.

Whether the code modulated signals are produced in the normal mode or the inversion mode is expressed by the inversion flag (inversion information) comprising 2-bit data added prior to the ID code as indicated in FIG. 1, and this undergoes pulse phase modulation into inversion flag signal by the same modulation methods as that for the code modulated signal. Here, the normal mode is expressed by (0,0) and inversion mode by (0,1) in 2-bit data of the same format as that of the units, and the pulse pause interval Tr is set corresponding to the 2-bit data in normal mode. Specifically, the inversion flag that expresses normal mode is modulated into an inversion flag modulated signal connecting the fixed pause period tm to the fixed pulse width tw, and the inversion flag that expresses the inversion mode is modulated into an inversion flag modulated signal connecting the fixed pulse width tw and the pulse pause interval Tr, in which Δt is added to the fixed pause period tm.

Figure 1B:
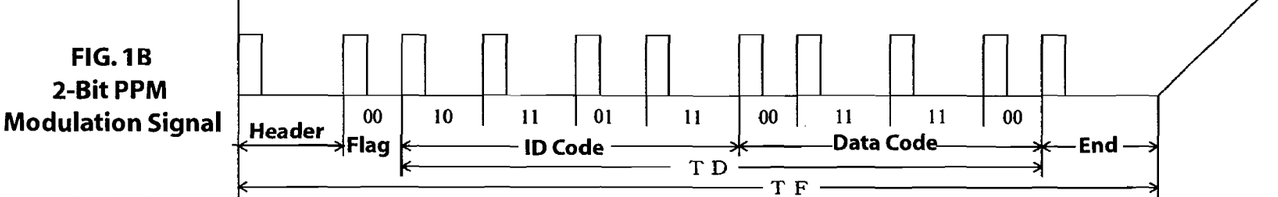
Figure 1C:
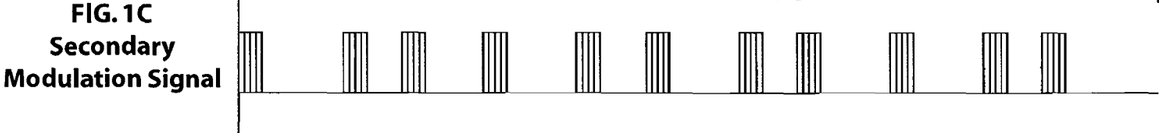
Figure 1D:
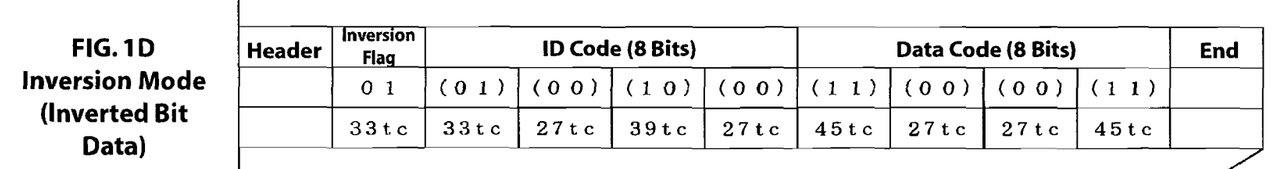
Figure 1E:
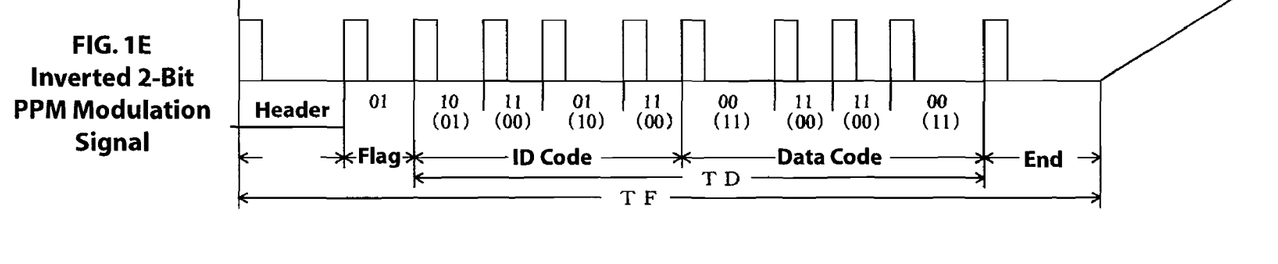

The 2-bit PPM modulated signal of FIG. 1(b) or FIG. 1(d) is generated by adding the header signal and the inversion flag modulated signal before, and adding the end signal after, the code modulated signals that have undergone pulse phase modulation in this way for every unit of 2-bit data.

In order to prevent mixing communications from other devices causing erroneous actuation, these 2-bit PPM modulated signals are further taken as the secondary modulated signals indicated in FIG. 1(c), in which 38 kHz carrier modulation waves have been modulated, and these are transmitted to the device to be controlled in infrared rays.

In normal mode, the transmission period TD of the code modulated signals, in which code comprising 16-bit data has been modulated, varies between 216 tc (5.86 msec), if all of the 2-bit data is (0,0), and 360 tc (9.47 msec), if all of the 2-bit data is (1,1); and if 2-bit data among the 8 units comprises mostly units that are (0,0) or (0,1), the transmission period is shorter, and conversely, if comprising mostly (1,0) or (1,1), the transmission period is longer.

Specifically, if the transmission period TD of the code modulated signal of the 16-bit data exceeds a given threshold value X, all of the 16-bit data is inverted, and when conducting pulse phase modulation following the inversion mode of FIG. 2, the transmission period TD or frame transmission period TF can be shortened. This threshold value X will be explained below using FIG. 3.

Figure 3:
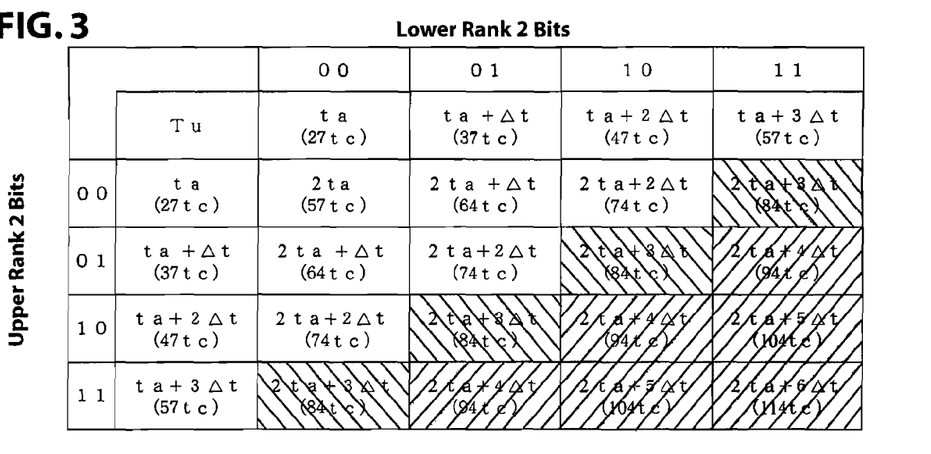
FIG. 3 is an explanatory diagram for deriving the threshold value X of the 4-bit data.

FIG. 3 illustrates the transmission period TD of the code modulated signal determined by incorporating and combining the 2-bit data of the units when 4-bit data undergoes pulse phase modulation in normal mode. As indicated in the diagram, the pulse interval Tu of the units is the sum of the fixed pulse width tw and the pulse pause interval Tr, and if ta is the sum of the fixed pause period tm and the fixed pulse width tw common in the units, the pulse interval Tu is any value from ta to ta+3Δt.

The 4-bit data comprises a combination of upper rank 2-bit data and lower rank 2 bit data; the transmission period TD of the code modulated signal is the sum of the pulse intervals Tu of the respective units; and the transmission period TD is 2ta at (0000), and is 2ta+6Δt at (1111). In the diagram, the combinations indicated with hash marks falling to the left are the combinations in which the transmission period TD is shortened when the 4 bit data are inverted, and the combinations indicated with the hash lines falling to the right are combinations in which the transmission period TD does not change even if the 4-bit data are inverted. Specifically, the threshold value X with 4-bit data is 2ta+3Δt.

Generally, because the pulse interval Tu of 1 unit is any value from ta to ta+3Δt, the mean value is ta1.5Δt, and the 4-N bit data (N is a positive integer) is divided into 2N units, and therefore, the wait time of the transmission period TD after the 4N bit data has undergone pulse phase modulation is (ta+1.5Δt)×2N=(2ta+3Δt)N. Specifically, this wait time value is the threshold value X of 4 bit data. Consequently, if the transmission period TD of the code modulated signal of the 4N-bit data exceeds (2ta+3Δt)N, the values of the 2-bit data are inverted, and the code modulated signal produced using the pulse pause interval Tr set to the inverted values can shorten the overall tran In the embodiment of the invention presently being described, ta is 27tc, based on the sum of the fixed pulse width tw and the fixed pause period tm, and Δt is 6tc, and therefore, the 4N-bit data threshold value X is 72Ntc, which is 288 tc in 16 bit data. In the code indicated in FIG. 1, the transmission period TD of the code modulated signal modulated in normal mode is 306tc, and because this exceeds the threshold value 288tc, the code modulated signal of the units is generated in inversion mode using the inversion flag (0,1). For example, as indicated in FIG. 1(d), the interval 21tc, in which Δt is added to the fixed pause period tm that is the pulse pause interval Tr set in relation to (0,1), is set for the 2-bit data of (1,0), and a code modulated signal of pulse interval Tu of 33tc is generated, in which the pulse pause interval Tr of 21tc is connected to the fixed pulse width tw of 12tc.

When generating the code modulated signal indicated in FIG. 1(d) in inversion mode from the 16-bit data comprising the ID code and data code indicated in FIG. 1(a), the transmission period TD is 270 tc, and is shorter than the transmission period TD of 306 tc in the normal mode.

Further, in the present embodiment, after the inversion flag has undergone pulse modulation in normal mode, the 16-bit data is easily processed without actually inverting the bit data values, and therefore the pulse modulation is conducted directly in the inversion mode indicated in FIG. 2.

Demodulation in the pulse modulation method of the present embodiment, which adds an inversion flag and conducts pulse phase modulation, decodes the pulse intervals Tu of the inversion flag modulation signal by comparing in the normal mode of FIG. 2, and if (0,0), demodulates the bit data in the normal mode of FIG. 2 from demodulated code modulation, and if (0,1), demodulates in inversion mode.

In the embodiments described above, the transmission period TD in normal mode of 4N-bit data may undergo pulse modulation in either normal mode or inversion mode when the threshold values are equivalent.

Moreover, in FIG. 2, the pulse pause interval Tr for the bit data may be set taking the normal mode to be the inversion mode and the inversion mode to be the normal mode; and further, the combination of the 4 kinds of pulse pause intervals with the 4 values of the 2-bit data is not limited to the present embodiment, and may be differing combinations as long as there is no overlapping.

The present invention applies to communication devices that transmit modulated signals in which code has undergone pulse phase modulation. An explanation as to several embodiments has been provided above, but this explanation is in no way intended to restrict the scope of the invention over the scope as defined according to the plain meaning of the claims. The scope of the invention is further intended to include all foreseeable equivalents to each of the elements of the claims.

The invention claimed is:

1. A pulse modulation method for dividing code comprising 4N-bit data (N is a positive integer) into units configured by every 2 bits of data, the method comprising the steps of:
after a pulse signal of a fixed pulse width tw has been generated, generating a code modulated signal for each unit of code by pausing between pulse pause intervals Tr for a pulse signal that has been set corresponding to value of the 2-bit data of that unit; and
connecting the code modulated signals for all units, characterized in that:
an optional adjusted time width of ½ or more and less than 1 of a fixed pulse width tw is taken to be $\Delta t$, and 4 types of pulse pause intervals Tr, in which any of the time widths 0, $\Delta t$, $2\Delta t$, and $3\Delta t$ is added to a fixed pause period tm of time intervals nearly equivalent to the fixed pulse width tw, are set according to a corresponding one of the 4 values of the 2-bit data;
if the sum total TD of the code modulated signal made from 4N-bit data is an interval of at least $[(2tw+2tm+3\Delta t)N+\Delta t]$ or more, the pulse pause interval Tr of every unit of code is substituted by a pulse pause interval Tr in which the value of the 2-bit data of each unit is set corresponding to the inverted 2-bit data;
the substituted pulse pause interval Tr is used to produce a code modulated signal from all of the units; and
an inversion flag signal that expresses inversion information is added to the connected code modulated signal.

2. The pulse modulation method according to claim 1, further characterized in that two types of pulse pause intervals Tr, the fixed pause period tm and the time wherein $\Delta t$ has been added to the fixed pause period tm, are set corresponding to the inversion information, and after a pulse signal of the fixed pulse width tw has been generated, an inversion flag signal is generated by pausing for the pulse signal between pulse pause intervals Tr that have been set corresponding to the inverted information.

* * * * *